US005981305A

United States Patent [19]

Hattori

[11] Patent Number: 5,981,305

[45] Date of Patent: Nov. 9, 1999

[54] MANUFACTURING METHOD FOR ELECTRIC FIELD EMISSION ELEMENT USING ULTRA FINE PARTICLES

[75] Inventor: Atsuo Hattori, Hamamatsu, Japan

[73] Assignee: Yamaha Corporation, Japan

[21] Appl. No.: 09/017,865

[22] Filed: Feb. 3, 1998

[30] Foreign Application Priority Data

Feb. 7, 1997 [JP] Japan .................................... 9-025665

[51] Int. Cl.$^6$ ..................................................... H01L 21/00

[52] U.S. Cl. ................................................. 438/20; 257/10

[58] Field of Search ................................ 438/20; 445/24, 445/50, 49; 257/10; 313/512, 306, 309, 310

[56] References Cited

U.S. PATENT DOCUMENTS

| | | | |
|---|---|---|---|
| 5,334,908 | 8/1994 | Zimmerman | 313/336 |
| 5,529,524 | 6/1996 | Jones | 445/24 |

OTHER PUBLICATIONS

M. Oda, et al., "Dry and Direct Drawing System Using Ultra Fine Particles", Denshi, Zairyo, Oct. 1994, pp. 1–9.

M. Oda, et al., "Ultra Fine Particle Conductive Paste for Low Firing Temperature Use", Low Temperature Sintered Paste Using Ultra Fine Particles, SMH Magazine, vol. 11, No. 1, pp. 28–32.

"Novel Thin Film Formation Using Ultra Fine Particles", Ulvac Technical Journal, No. 40, 1993, pp. 14–20.

R. Uyeda, "Studies of Ultrafine Particles in Japan: Crystallography. Methods of Preparation and Technological Applications", Progress in Materials Science, vol. 35, 1991, pp. 1–96.

*Primary Examiner*—Charles Bowers
*Assistant Examiner*—Craig Thompson
*Attorney, Agent, or Firm*—Ostrolenk, Faber, Gerb & Soffen, LLP

[57] ABSTRACT

A method for manufacturing field emission elements having sharp convex points (tips) that uses a mold concavity having a sharp concavity point (cusp) comprises the steps of preparing a substrate having an opening at least in its front surface, depositing a sacrificial film on the substrate, to form a mold concavity having a sharp concavity point in the opening, forming a film made up of electrically conducting ultra fine particles on the sacrificial film, to bury the mold opening and removing at least that portion of the sacrificial film that is at the concavity point. A method for manufacturing field emission elements with sharp convex points is provided, wherewith emitter material can easily be packed into a mold concavity having a sharp cusp.

7 Claims, 10 Drawing Sheets

150°C 5min

300°C 5min

200°C 5min

MANUFACTURING METHOD FOR ELECTRIC FIELD EMISSION ELEMENT USING ULTRA FINE PARTICLES

This application is based on Japanese patent application No. 9-25665, filed on Feb. 7, 1997, the entire contents of which are incorporated herein by reference.

BACKGROUND OF THE INVENTION a) Field of the Invention

The present invention pertains to a manufacturing method for a field emission element, and more particularly to a manufacturing method for a field emission element having a sharp tip using a mold concavity having a sharp cusp.

b) Description of the Related Art

A field emission element is an element (emitter) that emits electrons from a cathode tip having a sharp point by means of the action of an electric field. The sharper the convex point of the cathode tip, the stronger is the electric field concentration produced, and the more possible becomes efficient electron emission. It is also desirable to provide a control electrode that is centered on the cathode tip in order to generate an efficient electric field about the cathode tip.

U.S. Pat. No. 5,334,908 discloses a method for forming a mold concavity having a sharp concave end (cusp) above the concavity by means of forming on the surface of the substrate a concavity having perpendicular side walls, and depositing on the substrate surface a sacrificial film. If the sacrificial film is removed after the cathode layer is deposited above the mold concavity, a sharp convex cathode tip is exposed.

If an electrically conducting layer is formed on the substrate surface and a concavity is then formed which penetrates through the said conducting layer, then it is possible to form a control electrode with the conducting layer that has an opening in it, simultaneously with fabricating the cathode tip. The control electrode need not be limited to one electrode but may be made in a plurality of electrode layers.

The present applicant and his colleagues have proposed various methods for forming mold concavities having sharp cusps. For example, when a sacrificial film is deposited in a concavity having a rectangular cross-section, a sharp cusp is formed when the sacrificial film deposited on the two side walls meets in the middle. However, it is not always easy to control the film thickness or, for that reason, the height of the cusp. Control becomes easy by combining the deposition with a chemical reaction. More specifically, the growth of the film being deposited on the two side walls is stopped before it meets in the middle. After that, the surface of the deposited film is subjected to a chemical reaction and its volume thereby caused to expand so that the reacting film surfaces meet in the middle. By imparting a taper to the side walls on the upper side of the concavity, or causing the cross-sectional shape of the cathode tip to converge in two steps, the precision of fabricating the shape of the tips can be raised.

The formation of the cathode film to the top of the mold concavity was being done by sputtering, etc. When the concave tip of the mold concavity becomes sharp, it becomes very difficult to fill cathode emitter material all the way to the bottom of the sharp form. Voids readily develop when one tries to fill emitter material all the way to the bottom of a sharp form. Even if such filling is possible, the process margin becomes very narrow. As a result, the yield of the field emission element manufacturing process becomes low.

Thus, even if a mold concavity having a sharp cusp can be formed, if emitter material cannot be sufficiently filled all the way to the bottom of the cusp of the said mold concavity, a field emission element exhibiting the desired high performance cannot be realized.

SUMMARY OF THE INVENTION

An object of this invention is to provide a method of manufacturing a field emission element capable of easily filling an emitter material in a mold concavity having a sharp cusp. According to one aspect of this invention, there is provided a method for manufacturing a field emission element comprising the steps of: preparing a substrate having an opening in its surface; depositing a sacrificial film on the substrate to form a mold concavity having a sharp concave cusp in the opening; forming a film made of electrically conducting ultra fine particles, on the sacrificial film to bury the mold concavity, and removing at least a mold concavity portion of the sacrificial film.

Electrically conductive ultra fine particles can be obtained on a sacrificial film in a form having sufficiently small dimensions and sufficient fluidity. It is possible to fill such electrically conducting ultra fine particles all the way to the bottom, in sufficient density, even if the mold concavity is narrow and deep.

It is preferable that the electrically conducting ultra fine particles be obtained either in a form wherein they are dispersed in an organic solvent or in a form wherein they are dispersed in a gas.

A manufacturing method for a field emission element exhibiting outstanding transcription properties relative to the mold is proposed. If a mold is formed having a sharp mold concavity, it is possible to fabricate emitters having sharp tips.

DESCRIPTION OF THE PREFERRED EMBODIMENTS

Figure 1A:
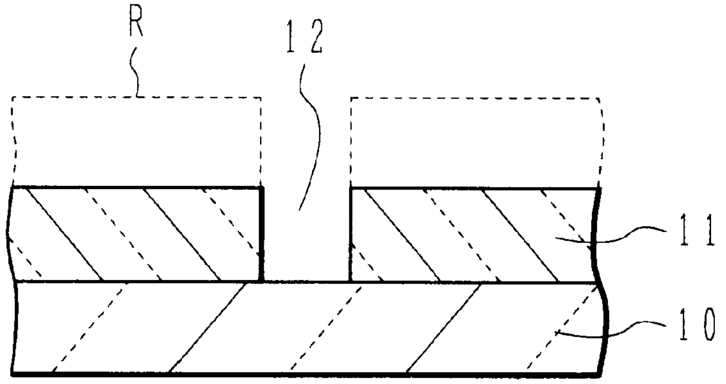
FIGS. 1A–1F are cross-sectional views of a substrate for illustrating a method for manufacturing a field emission element according to an embodiment of the present invention.

Before describing embodiments of the present invention, a simple explanation will be made on ultra fine particles.

When metal is evaporated in an inert gas, the evaporated metal atoms (or groups thereof) collide with gas molecules, colliding with each other while changing their directions, and groups of metal atoms are formed in which a plurality of metal atoms are bonded together. Depending on such conditions as the pressure of the gas, metal evaporation temperature, metal type, and exhaust speed, etc., the groups of bonded metal atoms will grow as they cool, forming fine particles that are either crystalline or amorphous.

Inside the inert gas atmosphere, each metal particle exists in an isolated state, without agglomerating. By making the mean particle diameter of the metal particles 10 nm or less, such physical property values are obtained that differ from those of the bulk metal. Such particles having a mean diameter of 10 nm or less and existing in an isolated state are called ultra fine particles. In general, ultra fine particles have extremely active chemical characteristics. In this Specification, the term "ultra fine particles" refers to particles having a mean particle diameter of 10 nm or less.

When ultra fine metal particles that maintain their isolation are formed in an inert gas, and the vapor of an organic solvent is introduced into the inert gas in this state, the organic solvent vapor covers the ultra fine metal particles, and the ultra fine particles are obtained in a colloidal state in the organic solvent, existing in a state wherein they are dispersed without aggregating.

Ultra fine particles are not limited to metals; they can also be obtained with semiconductors or dielectrics.

Ultra fine metal particles can be formed in an inert gas by providing a vacuum vessel equipped with a gas supply tube and an exhaust system, filling it with an inert gas, and evaporating metal inside the vessel. When the inside of this vacuum vessel is exhausted, the exhaust gas contains ultra fine metal particles that have been generated. Gasses that contain ultra fine metal particles are fluids that may be handled like ordinary gasses. When ultra fine metal particles contained in an isolated state in such an inert gas are sprayed onto a substrate together with the inert gas, the ultra fine metal particles can be deposited on the substrate. This method is known as the ultra fine metal particle gas deposition method.

Furthermore, when a state is realized in which ultra fine metal particles are contained in an inert gas in an isolated state, and an organic solvent is supplied so as to form ultra fine metal particles as a colloid in the organic solvent, they can be recovered in the form of an ultra fine metal particle fluid. This fluid that contains ultra fine metal particles is in a liquid form, and can be applied to a substrate by a spin coating technique or by printing, etc.

Metals particularly used as ultra fine metal particles include Au, Ag, Pd, and Ag—Pb. The organic solvents used include toluene ($C_7H_8$), α-terpineol ($C_{16}H_{18}O$), and xylene ($C_{18}H_{10}$). Liquid-form fluids containing ultra fine metal particles can be obtained in which the concentration of the metal component is approximately 70 to 80 wt %.

A method for manufacturing field emission elements according to a basic embodiment of the present invention will now be described, making reference to FIGS. 1A–1F.

As is depicted in FIG. 1A, a substrate is prepared by forming a layer 11 of low-melting-point material on the surface of a supporting substrate 10. The low-melting-point material layer 11 may be formed on the support substrate 10 by some method such as sputtering, chemical vapor deposition (CVD), or coating. A resist mask R having an opening in it is formed on the surface of the low-melting-point material layer 11, and the low-melting-point material layer 11 is etched by anisotropic etching using the resist mask R as a mask. An opening 12 that has more or less perpendicular side walls is formed in the low-melting-point material layer 11. After this, the resist mask R is removed.

A single opening 12 is depicted in the Figure. However, if a low-melting-point material layer having multiple openings is formed on a single substrate, multiple emitters can be fabricated simultaneously. By arranging the multiple emitters in the desired layout, it is possible to form a field emission emitter array (FEA).

The plan shape of the opening 12 is a circle when a point-shaped emitter is being made, and a stripe shape when a wedge-shaped emitter is being made.

The reason why an opening 12 having roughly perpendicular side walls is made is that by so doing the dimensional precision of the opening 12 is enhanced; the side walls need not be perpendicular so long as the dimensional precision is sufficient. The side walls may be tapered, for example, or the perpendicular side walls with side spacers thereon may be possible.

The supporting substrate 10 may be formed, for example, from an insulating substrate such as glass or quartz, etc. a semiconductor substrate of Si, Ge, or GaAs, etc., or an electrically conducting substrate such as Al or Cu, etc. The low-melting-point material layer 11 may be a single layer, or a layer having a multi-layer structure, made of a low-melting-point glass such as phosphosilicate glass (PSG), borophosphosilicate glass (BPSG), arsenosilicate glass (AsSG), or phosphogermanosilicate glass (PGSG), frit glass (compound of Pb, Zn, Si, and O, etc.), Kovar (TM, alloy of Fe, Co, and Ni), solder (alloy of Pb and Sn, etc.), Si—Ge alloy, or a low-melting-point metal (Cd, In, Sn, Tl, Pb, Bi, Po, or At, etc.). When a multi-layer structure is employed, it is preferable that the uppermost layer have the lowest melting point.

The description that follows is for an example case wherein the supporting substrate 10 is an $SiO_2$ substrate, and the low-melting-point material layer 11 is a low-melting-point glass layer. When the low-melting-point glass is BPSG, it is possible to base the deposition of the low-melting-point glass layer on CVD, as in the $SiO_2$ film deposition, and to do the fabrication adding 9.1 mol % of $B_2O_3$ and 5.3 mol % of $P_2O_5$ to the raw material gas for the $SiO_2$.

In fabricating the opening 12, in addition to lithography using the resist mask discussed above, ion milling, etc., may also be used. The size of the opening 12 is designed according to the size of the required cold-cathode emitter. Openings (concavities) are formed, for example, having either circular diameters or rectangular short-side lengths of from 0.1 to 1 μm and depths that are half that value or more. When this is done, the aspect ratio will be 1/2 or greater. It is preferable to form openings having an aspect ratio of from 1/2 to 1, for example.

When forming the opening, instead of using a resist mask, the low-melting-point material layer 11 can be processed directly using ion milling or a laser beam.

Figure 1B:
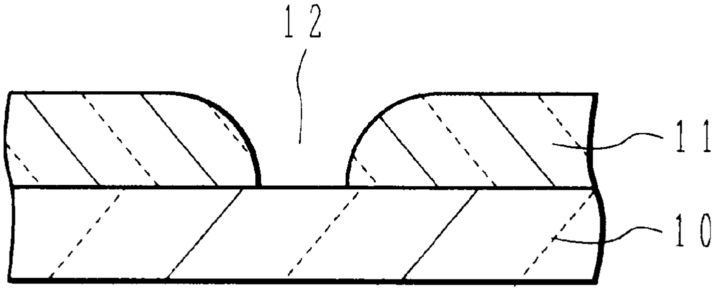

As indicated in FIG. 1B, the low-melting-point material layer 11 provided with the opening 12 is heated and made to reflow. By the reflowing the low-melting-point material layer 11, an opening 12 is obtained that has its square edges rounded off and that exhibits a smooth slope in the upper part of its side walls.

When the low-melting-point material layer 11 is PSG or BPSG, the melting point is between 750° C. and 950° C. By achieving a thermal treatment in a resistance heating furnace for 10 to 200 minutes at a temperature above the melting point, the low-melting-point material layer 11 can be made to reflow.

If lamp annealing or laser heating is employed, reflow is possible in a shorter time of from 10 to 100 seconds. When a BPSG film is made to reflow under lamp annealing, it is sufficient to raise the temperature in an $N_2$ atmosphere, for example, from room temperature to between 850° C. and 1050° C. in 10 seconds, and to hold the film in this heated state for from 10 to 60 seconds.

As to imparting a smooth slope to the side walls at the top of the opening, this is an effective technique for enhancing the positional precision of the end of the tip when subsequently forming the emitter tip, but this is not absolutely necessary.

Figure 1C:
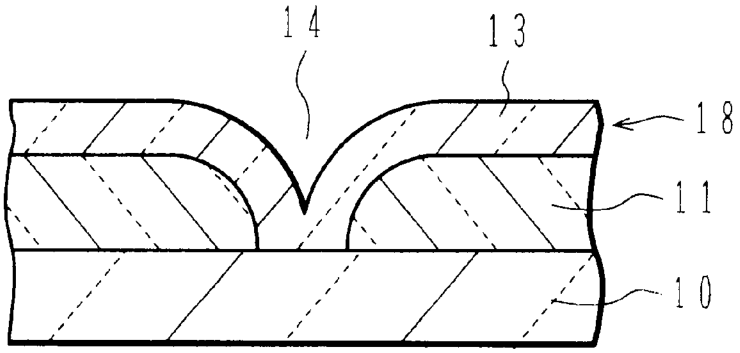

As is shown in FIG. 1C, a sacrificial film 13 is deposited on the substrate surface so as to bury the opening 12 that has been formed in the low-melting-point material layer 11. It is preferable that the sacrificial film 13 be formed by a film deposition method offering good step coverage, such, for example, as reduced or low-pressure CVD. The sacrificial film 13 is formed of a silicon oxide film, for example. If a film having a thickness of half a diameter of the opening is deposited, the opening will be occupied by the film deposited from the both sides.

The surface shape of the said sacrificial film 13 becomes the mold for the emitter that is formed after that. A concavity 14 having a sharp concave point is formed, as is shown in the Figure. When the side surface of the opening 12 is perpendicular, the bottom of the concavity 14 changes abruptly when the sacrificial film surfaces from the both side surfaces meet together.

By means of the reflow treatment, the upper side walls of the opening 12 are opened in a smooth curve in a progressive taper, as indicated in FIG. 1B. For this reason, the reproducibility of the cusp shape at the point of the concavity is enhanced when forming the sacrificial film 13 with a deposition method providing good step coverage. In this manner, a mold concavity 14 having a sharp concavity point is obtained with good reproducibility.

Figure 1D:
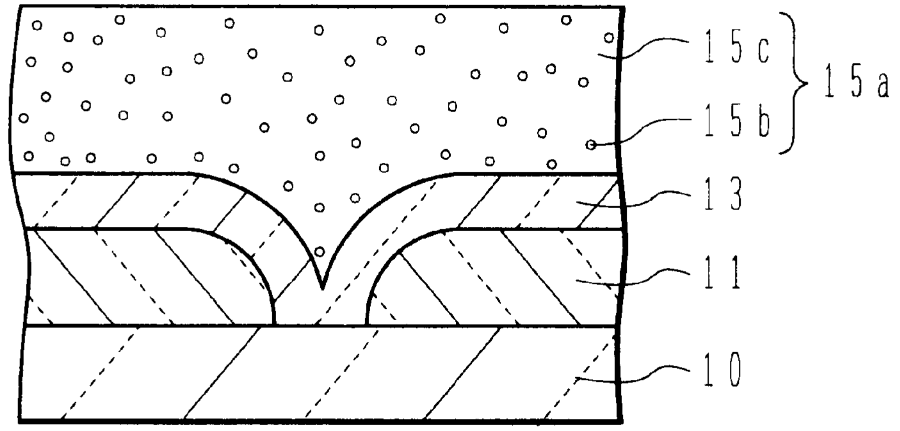

As is depicted in FIG. 1D, a film 15*a* of ultra fine particle fluid is formed on the sacrificial film 13 so as to bury the mold concavity 14. The ultra fine particle fluid is a fluid wherein metal particles 15*b* having diameters of 10 nm or less are dispersed, without agglomeration, in an organic solvent 15*c*. This ultra fine particle fluid film 15*a* can be formed by spin coating, for example. While doing the coating, and immediately after the coating, the metal particles 15*b* in the ultra fine particle fluid are filled inside the mold concavity while retaining their mutually independent state.

An ultra fine particle fluid is used in which 50 wt % of Au ultra fine particles are dispersed, using toluene ($C_7H_5$) having a boiling point of 110° C. as the organic solvent. It will also be possible to use either xylene ($C_6H_{10}$) having a boiling point of 140° C. or α-terpiniol having a boiling point of 219° C. as the solvent.

Figure 1E:
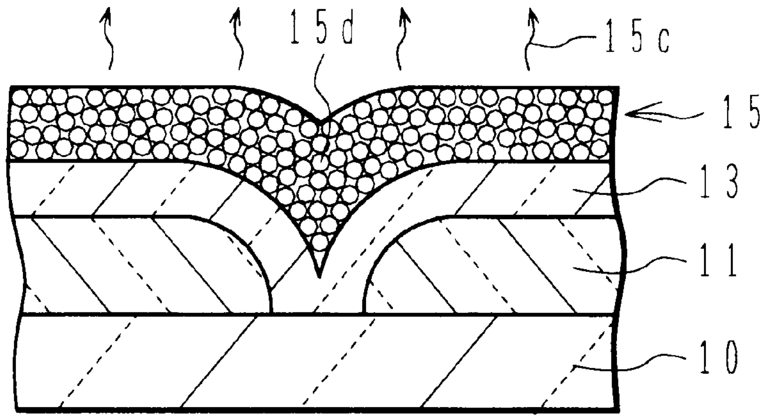

As depicted in FIG. 1E, the substrate is heated to a temperature between about 150° C. and 200° C. It may, for example, be heated for 15 minutes on a hot plate. Lamp heating and laser heating will also be possible. It would be preferable to make the heating temperature higher than the boiling point of the solvent. The organic solvent 15*c* of the ultra fine particle fluid evaporates and is released into the atmosphere, while the remaining metal particles 15*b* contact each other and grow into metal particles 15*d* that are of the order of 50 nm in diameter. These metal particles 15*d* form a continuous film following the shape of the mold concavity. In this manner is formed a film 15 made up of ultra fine metal particles.

Figure 1F:
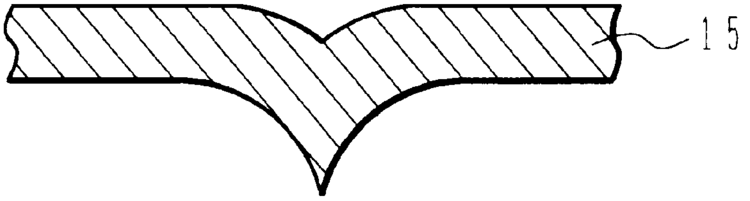

As is represented in FIG. 1F, by removing the supporting substrate 10, the low-melting-point material layer 11, and the sacrificial film 13 by etching or the like, the film 15, made up of ultra fine metal particles, is obtained. On the bottom of the film 15 that is made up of ultra fine particles, a sharp emitter point is exposed. It is possible, in this way, to obtain fine emitters that exhibit radii of curvature of 10 nm or less at their tips.

In view of the function of an emitter to emit electrons, the required thickness of the emitter film 15 is extremely thin. However, there is a danger of not having mechanical strength if the thickness of the emitter film is too thin after the substrate and sacrificial film have been removed.

Figure 2A:
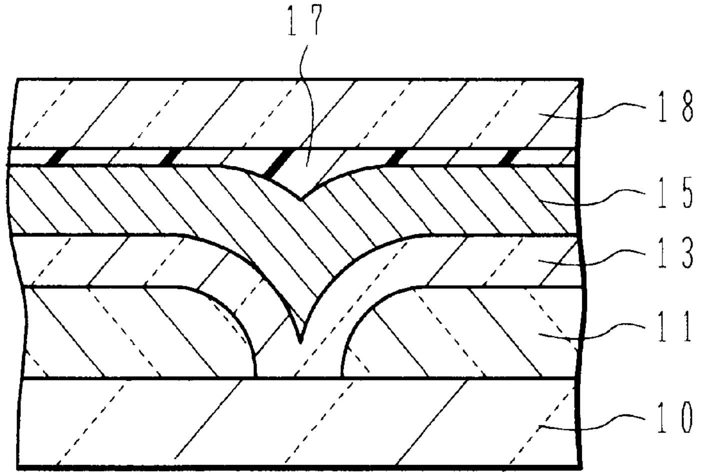
FIGS. 2A–2C are cross-sectional views of a substrate for illustrating methods of enhancing the mechanical strength of an emitter.
Figure 2B:
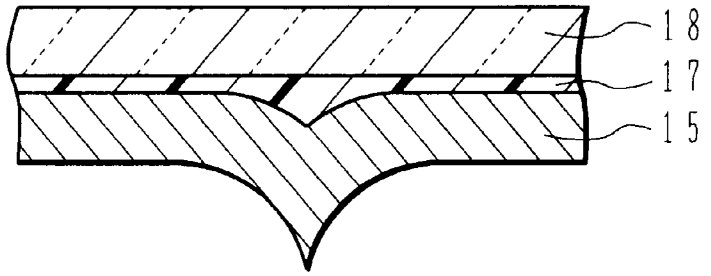
Figure 2C:
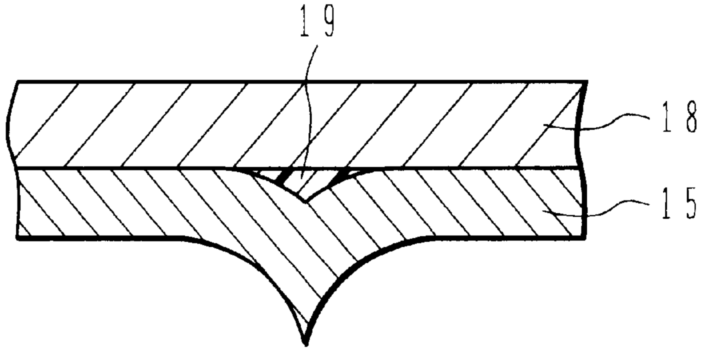

In FIG. 2A–2C, is depicted a configuration that can reinforce the strength of the emitter film.

As is shown in FIG. 2A, after forming the emitter film 15 by means of the process indicated in FIG. 1E, a supporting substrate 18 is applied via an adhesive 17. The supporting substrate 18 need only be something having a sufficient mechanical strength. Use may be made of an insulating material like glass, a semiconductor like silicon, or a conductor like Al. It is also possible to apply the supporting substrate 18 directly to the emitter layer 15 by anode bonding or the like, without using the adhesive 17.

If a material having a planarizing function, such as SOG, is used as the adhesive layer 17, after planarizing the surface, the supporting substrate 18 can be applied very securely. It is also possible to apply the supporting substrate 18 after planarizing the emitter layer 15 by chemical mechanical polishing (CMP). It is also permissible to form a planarizing layer on the emitter layer, and then to apply an adhesive layer and a supporting substrate on top of that. After fixing the support substrate 18 to the emitter layer 15, the support substrate 10, and the layers 11 and 13 are removed to expose the tip of the emitter layer 15, as shown in FIG. 2B.

If the upper-surface concavity of the emitter layer 15 is buried with a filler material 19, and an electrically conducting supporting substrate 18 is bonded to the emitter layer 15 with low resistance, as depicted in FIG. 2C, the resistance of the emitter can be lowered. It is also permissible to use as the electrically conducting supporting substrate 18 one that has an electrically conducting pattern on an insulating substrate.

A manufacturing process for forming emitters has been described in the foregoing. It is also possible to form control electrodes and anodes simultaneously with forming the emitter.

In FIG. 3A–3H is shown a process for forming the emitter and a control electrode simultaneously.

Figure 3A:
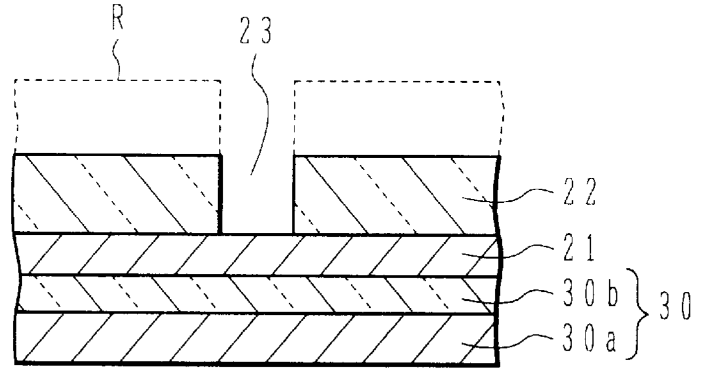
FIGS. 3A–3H are cross-sectional views of a substrate for illustrating a method for manufacturing a field emission element according to another embodiment of the present invention.

As depicted in FIG. 3A, a substrate 30 is prepared in which an electrical conductor layer 30*a* and an insulating film 30*b* are laminated. Another electrically conducting layer 21 is formed on the surface of the insulating film 30*b* of the substrate 30. For this conducting layer 21, a semiconductor such as Si, or a metal such as W silicide, Mo silicide, W, Mo, Ta, Ti, or Cr can be used. A low-melting-point material layer 22 is formed on the conducting layer 21. After that, this laminated structure is subjected to the same processing as is diagrammed in FIG. 1A–1F.

First, a resist mask R is formed on a low-melting-point material layer 22. Using this resist mask R as an etching mask, the low-melting-point material layer 22 is patterned by anisotropic etching. An opening 23 having more or less perpendicular side walls is formed in the low-melting-point material layer 22. Then the resist mask R is removed.

Figure 3B:
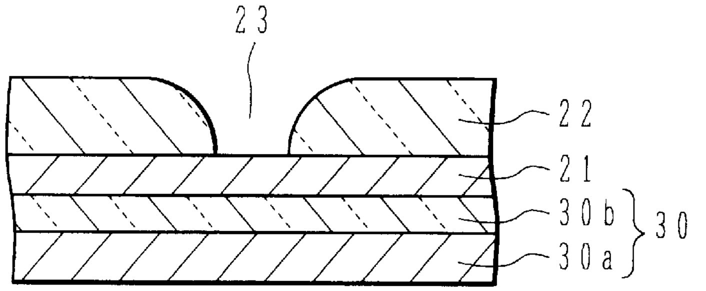

As is indicated in FIG. 3B, the low-melting-point material layer 22 is heated and made to reflow. This reflowing causes the square edges in the side walls of the opening 23 in the low-melting-point material layer 22 to be rounded, and a taper that changes slope smoothly is formed at the top of the opening 23.

Figure 3C:
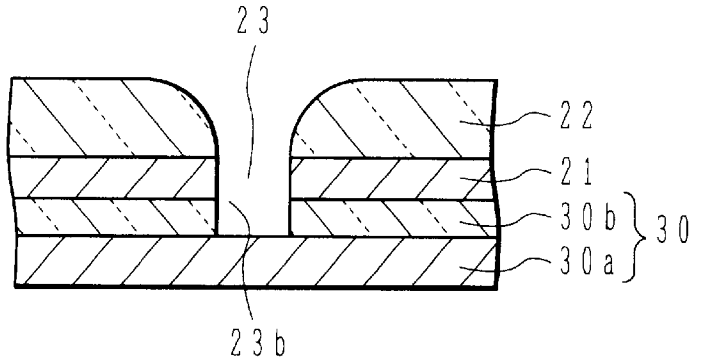

As is shown in FIG. 3C, using the opening 23 in the low-melting-point material layer 22 as a mask, the electrically conducting layer 21 and insulating film 30*b* that are exposed at its bottom are etched. The opening 23 is enlarged downwardly, and perpendicular side walls 23*b* are formed.

Figure 3D:
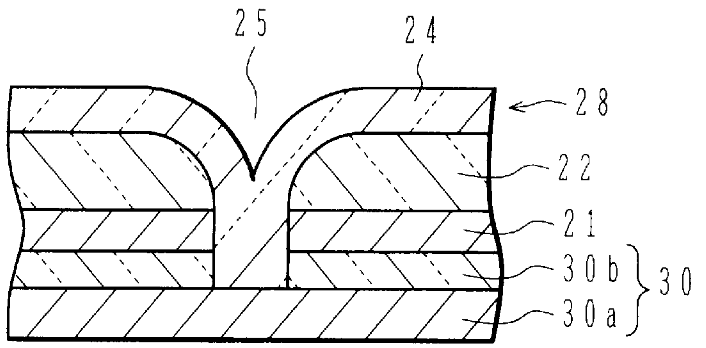

A sacrificial film 24 is formed on the surface of the laminated structure by a method offering good step coverage, so as to bury the opening 23, as depicted in FIG. 3D. The sacrificial film 24 is formed of a material having different etching characteristics from the low-melting-point material layer 22. When the low-melting-point material layer 22 is formed of PSG or BPSG, the sacrificial film 24 may be formed from silicon nitride film. When the low-melting-point material layer 22 is formed of a low-melting-point metal, the sacrificial film 24 may be formed of an $SiO_2$ film, a silicon nitride film, or a low-melting-point glass film, etc. By depositing the sacrificial film 24 onto the interior walls of the opening 23, a mold concavity 25 having a sharp point is formed. In this manner is formed a mold 28 that includes a conducting layer 21 having an opening in it.

Figure 3E:
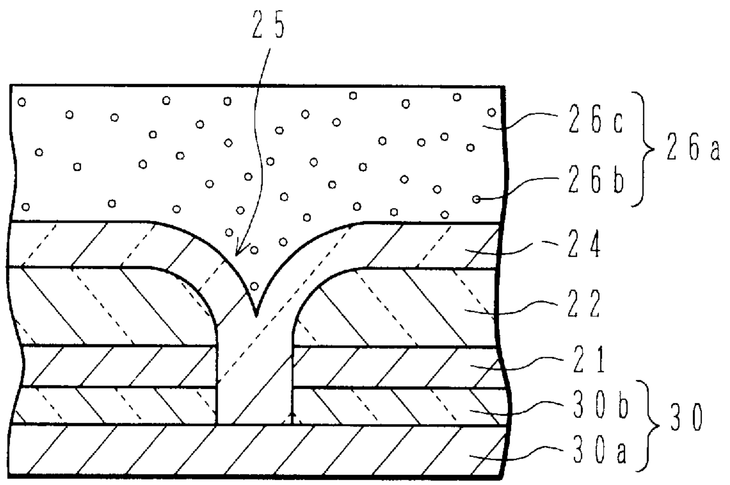

As diagrammed in FIG. 3E, a film 26*a* of an ultra fine particle fluid wherein ultra fine metal particles 26*b* are dispersed in an organic solvent 26*c* is formed on the sacrificial film 24 having the mold concavity 25. The ultra fine particle fluid may be spin-coated on, for example.

Figure 3F:
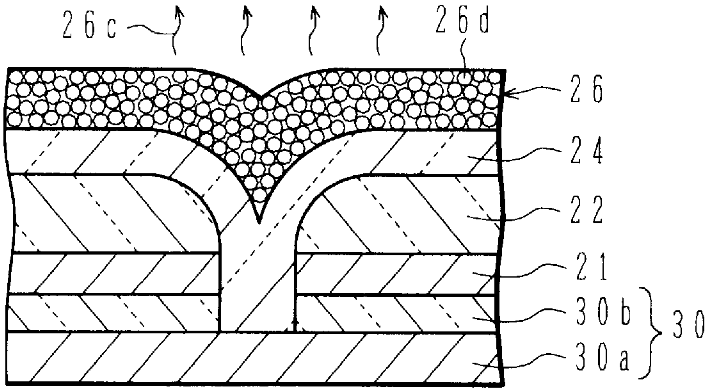

The substrate is heated to between 150° C. and 200° C., as indicated in FIG. 3F, the organic solvent 26*c* is evaporated from the ultra fine particle fluid film, the ultra fine particles 26*b* are made to grow, forming particles 26*d*, and an emitter layer 26 is formed.

Comparing this configuration to the configuration shown in FIG. 1E, the points of difference are the conducting layer 21 and the conductor layer 30*a* that are below the emitter layer.

Figure 3G:
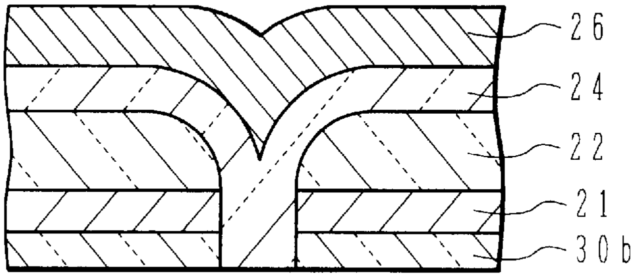

As is indicated in FIG. 3G, the conductor layer 30*a* of the substrate 30 is removed, exposing the insulating film 30*b* and the lower extremity of the sacrificial film 24.

Figure 3H:
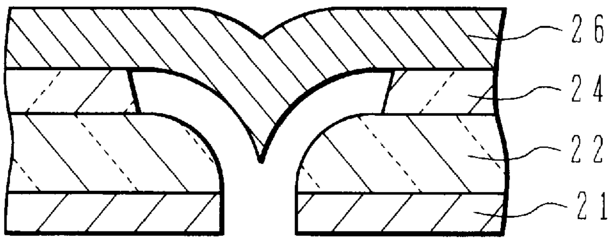

Then the insulating layer 30*b* and some of the sacrificial film 24 are etched further, exposing the sharp point of the emitter layer 26, as shown in FIG. 3H. If this configuration is employed, the electrically conducting layer 21 functions as a control electrode for the emitter layer 26.

It is noted in FIG. 3G, furthermore, that the conductor layer 30*a* of the substrate 30 is removed. It is also permissible, however, to leave the conductor layer 30*a* as it is, make a slit-shaped or otherwise shaped opening that extends from the upper surface of the emitter layer 26 to the sacrificial film 26, and partially remove the sacrificial film 24 from above. In that case, the conductor layer 30*a* on the substrate 30 can be used as an anode.

In the embodiments described above, an ultra fine particle fluid was used wherein ultra fine metal particles were dispersed in an organic solvent. Experimental verification was then made to determine how an electrical conductor could be packed into the sharp cusp-shaped concavity using such an ultra fine particle fluid.

FIG. 4A–4D are diagrams for illustrating the results of these experiments.

Figure 4A:
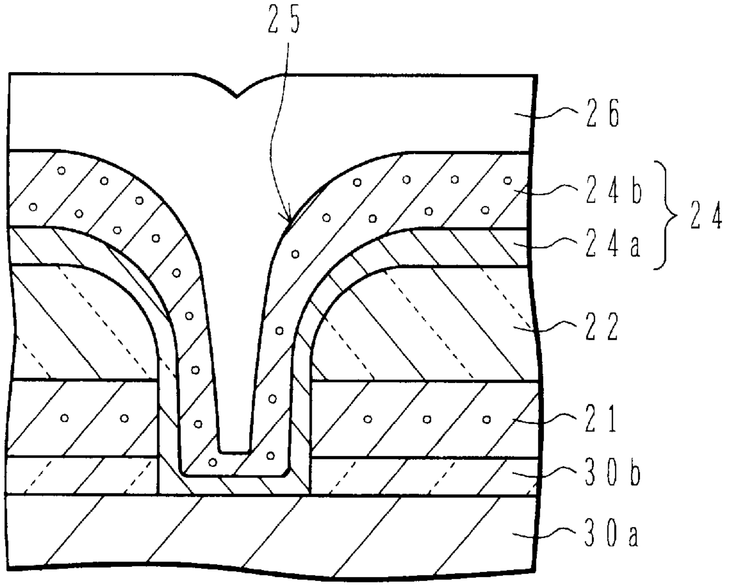
FIGS. 4A–4D are simplified cross-sectional views for illustrating experiments, together with the results thereof, conducted using ultra fine particle fluid in which ultra fine metal particles are dispersed in an organic solvent.

In FIG. 4A, is represented an example configuration used in the experiments. An insulating film 30*b* is formed on a support substrate 30*a* of the substrate 30, onto which, in turn, is formed a conducting layer 21 of polycrystalline silicon. On this polycrystalline silicon layer 21, is formed a low-melting-point silicon oxide layer 22 with an opening, and the upper sides of the opening thereof are rounded by reflow.

Onto the low-melting-point material layer 22, is formed a sacrificial film 24 made by laminating a TiN layer 24*a* and an amorphous silicon layer 24*b*, so as to cover the surface of the opening. The upper surface of the sacrificial film 24 forms a mold concavity 25 in the opening. Because this is an experiment to verify the packing results, the bottom of the mold concavity 25 was machined so as to have a rectangular cross-section.

An ultra fine particle fluid film 26 wherein ultra fine metal particles were dispersed in an organic solvent was formed on the mold concavity 25 made in this way, and subjected to various heat treatments. Then observations were made to determine how the mold concavity 25 was filled. Perfect Gold, made by Nippon Yakin Co., Ltd., was used as the ultra fine particle fluid.

Figure 4B:
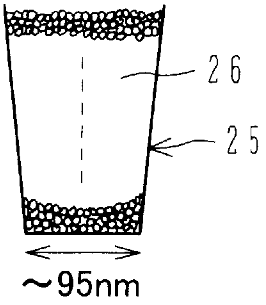

After forming the film of ultra fine particle fluid, it was subjected to heat treatment at 150° C. for 5 minutes. The result is depicted in FIG. 4B. The diameter of the bottom of the mold concavity 25 is approximately 95 nm. When heat-treated at 150° C., the diameter of the ultra fine particles was approximately 5 nm, the ultra fine particles were well packed into the shape of the mold concavity 25, and the packing characteristics were good.

Figure 4D:
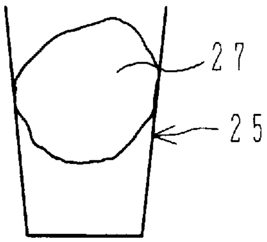
Figure 4C:
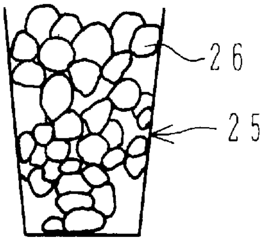

In FIG. 4C is depicted the result of heat-treating for 5 minutes at 200° C. When the heating temperature was raised to 200° C., the diameter of the particles inside the conducting layer 26 formed from the ultra fine metal particles became approximately 20 nm. Since the particle diameters became large, the packing characteristics (i.e. transferability relative to the mold) was deteriorated.

In FIG. 4D is depicted the result of heat-treating for 5 minutes at 300° C. When the heating temperature was raised to 300° C., a bulk-form conducting lump 27 was produced from the film formed by the fluid containing the ultra fine metal particles, and transferability relative to the mold 25 was further deteriorated. Under these conditions, it would surely be very difficult to form a good emitter layer.

In the experiments discussed above, Perfect Gold, made by Nippon Yakin Co., Ltd., was used as the ultra fine metal particles. If some other material is used, the heat-treatment conditions for forming the emitter layer after forming the film with the fluid containing the ultra fine metal particles will probably change. Nevertheless, in view of the characteristics of ultra fine metal particles in general, a heating temperature between about 150° C. and about 200° C. is probably preferable.

In the foregoing has been described the case of forming an emitter layer using a fluid wherein ultra fine metal particles are dispersed in an organic solvent. In addition to fluids wherein they have been dispersed in an organic solvent, ultra fine metal particles are also obtainable in a form wherein they are dispersed in a gas.

Figure 5:
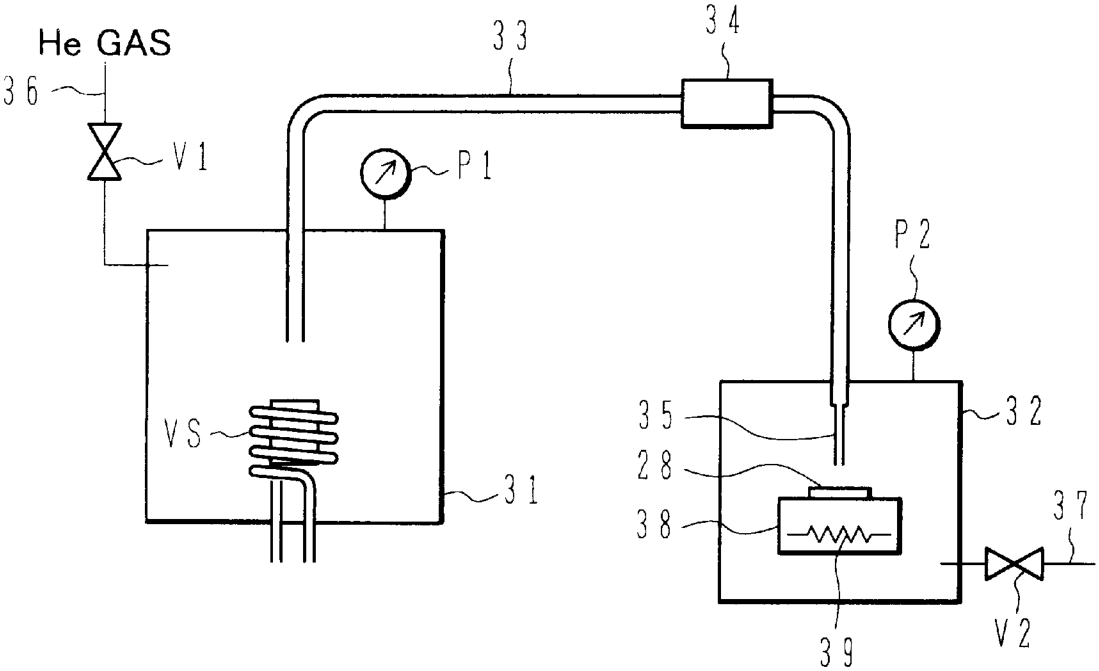
FIG. 5 is a simplified cross-sectional view of an ultra fine particle film forming apparatus for explaining a method for manufacturing a field emission element according to another embodiment of the present invention.

FIG. 5 is a schematic diagram for illustrating a method for manufacturing field emission elements according to another embodiment of the present invention. FIG. 5 depicts an apparatus for supplying ultra fine metal particles dispersed in a gas to a substrate and forming a film consisting of ultra fine metal particles.

An ultra fine metal particle generator chamber 31 is formed of a vacuum vessel, to which are connected a gas supply pipe 36 having a valve V1, a transfer pipe 33, and a pressure gauge P1 for detecting pressures inside the vacuum vessel. A vapor source VS for generating metal vapor is positioned inside the vacuum vessel. The vapor source VS is configured as a combination of a resistance-heating heater and a metal source or of a metal source and an induction-heating oven.

The pressure inside the vacuum vessel can be regulated between approximately 500 Torr and 5 atmospheres. The gas supply pipe 36 supplies an inert gas such as helium gas to the vacuum vessel. When metal vapor is generated from the vapor source VS in the inert gas, the metal vapor repeatedly collides with the gas molecules so that ultra fine metal particles are formed. These ultra fine metal particles are sent to the transfer pipe 33 using helium gas as the carrier gas.

The transfer pipe 33 is connected to a film forming chamber 32 via a buffer 34 that is provided with a shutter. The ultra fine metal particles are injected into the film forming chamber 32 together with the helium gas from a nozzle 35. The film forming chamber 32 is formed of a vacuum vessel and is connected to an exhaust pipe 37 that has a valve V2. A pressure gauge P2 is connected to this vacuum vessel. The pressure in the film forming chamber is regulated to approximately 10 Torr, for example.

Due to the pressure difference between the vacuum vessels 31 and 32, the helium gas inside the ultra fine particle generator chamber 31 is sent to the film forming chamber 32 through the transfer pipe 33. Inside the film forming chamber 32, a stage 38 is positioned, capable of moving in the X, Y, and Z directions. Onto this stage 38 is placed a substrate (mold) 28. This mold 28 may be, for example, a substrate in which is formed a mold concavity 25 such as is depicted in FIG. 3D. A heater 39 is provided inside the stage 38, so that the substrate 28 can be heated to the requisite temperature.

By means of the processes illustrated in FIGS. 3A–3D, a substrate 28 having a mold concavity 25 is fabricated and this is placed on the stage 38. The substrate 28 is then heated by the heater 39 to between about 150° and about 200° C. Onto this substrate are sprayed, from the nozzle 35, the ultra fine metal particles suspended in helium gas. The ultra fine metal particles reach the substrate 28, carried by the gas flow, and grow a film on the substrate 28.

Film growth by means of such ultra fine metal particles will vary according to the pressure difference between the ultra fine metal particle generator chamber and film forming chamber, substrate temperature, and type of ultra fine metal particle, etc. Experimentally speaking, it is preferable to seek out conditions wherewith the mold concavity packing characteristics are high, the electrical resistance of the film produced is low, and the mechanical strength is high.

In general, as the pressure difference increases, the gap between the particles diminishes, the density of the film becomes higher, and the film surface becomes smoother. Also, as the pressure difference increases, the adhesive strength relative to the underlying surface increases. The adhesive strength to the underlying surface also increases as the substrate heating temperature rises. When the substrate is heated, not only does the adhesive strength increase, but a decrease in void is observed also. It is desirable that optimum film forming conditions be determined experimentally, taking such general characteristics as these into consideration. Field emission elements formed in this way can be employed in flat panel displays, etc.

Figure 6:
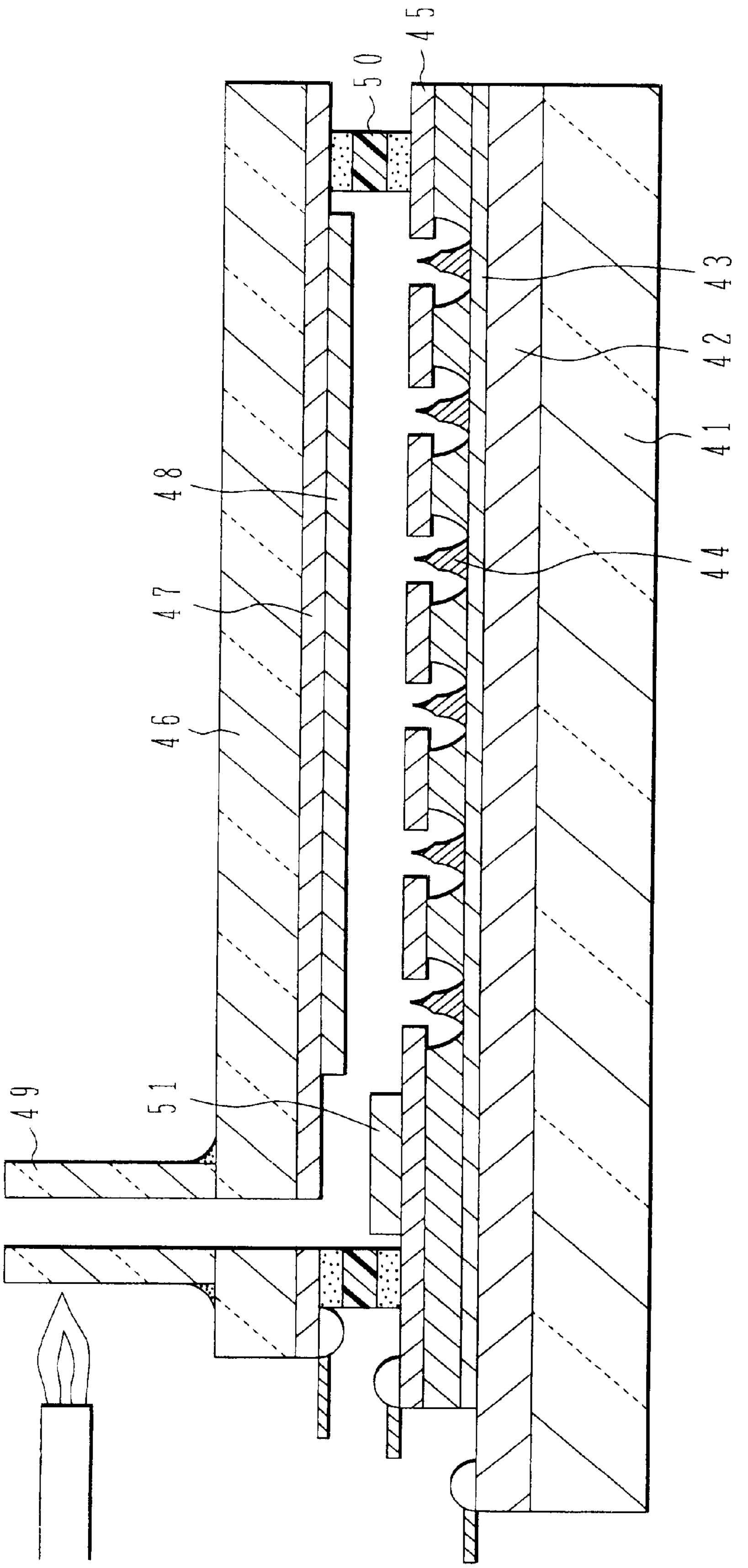
FIG. 6 is a cross-sectional view of an example configuration of a flat panel display.

FIG. 6 is a cross-sectional view of a flat panel display using the field emission element described above as the emitter electrode.

A field emission element is either an emitter electrode or a two-electrode element containing an emitter and a control electrode manufactured by either of the methods described in the embodiments noted above. On a supporting substrate 41 made of an insulating body, a wiring layer 42 made of Al or Cu, etc., and a resistance layer 43 made of polycrystalline Si, etc. are formed. On the resistance layer 43, a multiplicity of emitter electrodes 44 is arranged, each having a point in which the radius of curvature at the point and the apex angle of the small-diameter portion below the point are small, thus forming a field emission emitter array. Gate electrodes 45 have openings near the points of each emitter electrode 44, in such a manner that a voltage can be applied independently at each opening. It is also possible to apply respective voltages to the multiple emitter electrodes 44 independently.

Opposite an electron source that includes an emitter electrode 44 and a gate electrode 45, an opposing board is positioned that comprises a transparent substrate 46 made of glass or quartz, etc. The opposing board has a transparent electrode (anode) made of ITO, etc., positioned below the transparent substrate 46, and below that is positioned fluorescent material 48.

The electron source and the opposing board are jointed across spacers 50 made of glass substrate and having an adhesive applied thereto, so that a distance of the order of 0.1 to 5 mm is maintained between the transparent electrode 47 and the emitter electrode 44. A low-melting-point glass, for example, may be used as the adhesive.

Instead of using a glass substrate for the spacers 50, the spacers 50 may also be configured by dispersing glass beads or the like in an adhesive such as epoxy resin.

A getter 51 is formed of Ti, Al, or Mg, for example, to prevent the readherence of out-gasses to the surface of the emitter electrodes 44.

An exhaust tube 49 is formed beforehand on the opposing board. Using this exhaust tube 49, the interior of the flat panel display is vacuum-exhausted to between $10^{-5}$ and $10^{-9}$ Torr, after which the exhaust tube 49 is sealed with a burner, etc. After that, Connections are made for the anode electrode (transparent electrode) 47, the emitter electrodes 44, and the gate electrodes 45, thus completing the flat panel display.

Figure 7:
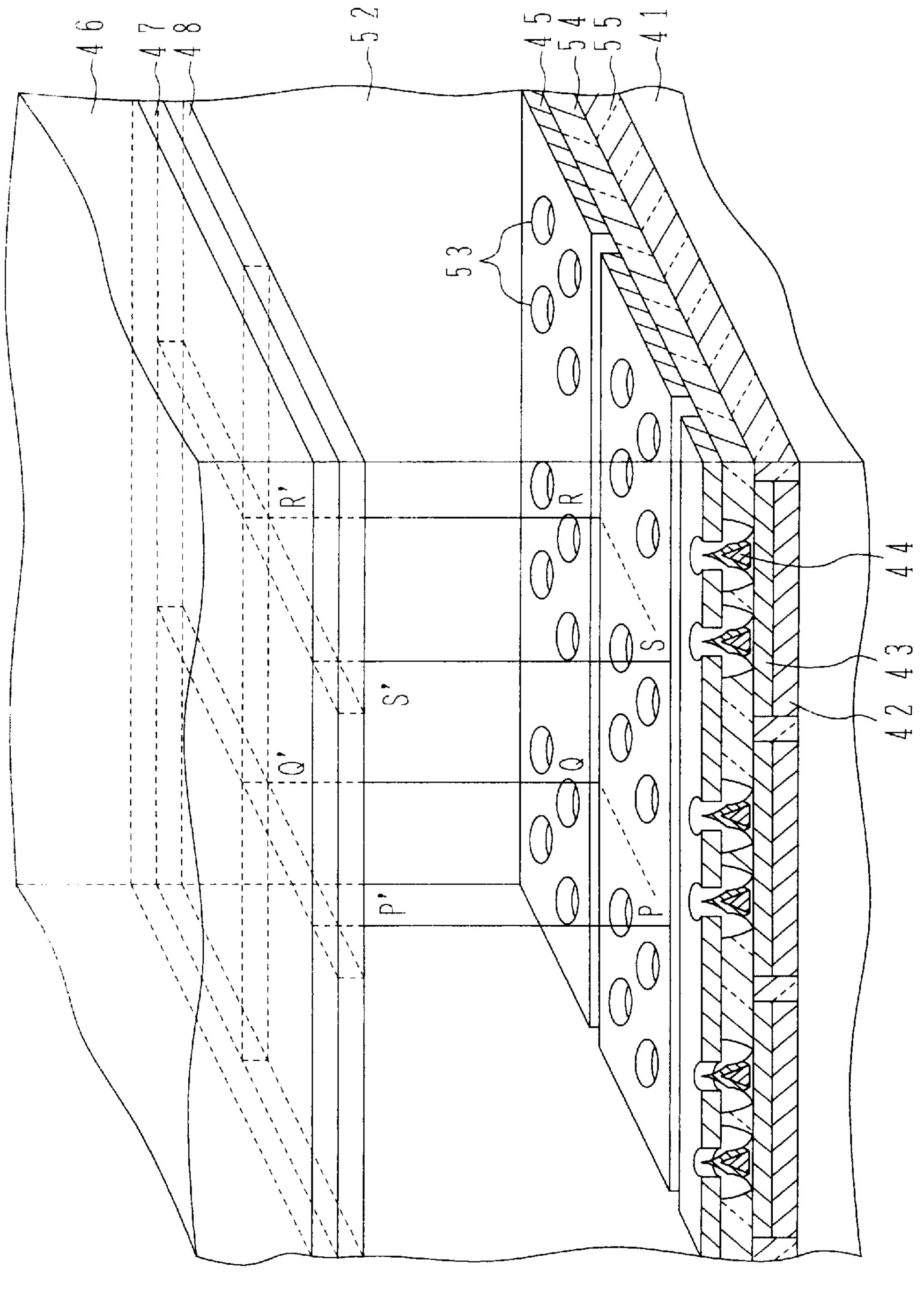
FIG. 7 is a perspective view of an example configuration of a flat panel display.

FIG. 7 is a perspective view of the flat panel display. The gate electrode 45 has multiple gate holes 53 in it. An emitter electrode 44 is formed corresponding to each gate hole 53. The tips of the emitter electrodes 44 are partitioned by an insulating film 54. Electrons emitted from the emitter electrodes 44 are radiated to the fluorescent material 48 through a vacant space 52 that is a vacuum, causing light emission to occur.

The flat panel display is formed with multiple pixels. Each pixel consists of an electron source region PQRS made up of four emitters and a corresponding opposing-board region P'Q'R'S'.

The resistance layer 43 and interconnect layer 42 formed below the emitter electrodes 44 are partitioned off for each pixel (four emitter electrodes) by a planarizing layer (insulating film) 55.

Figure 8:
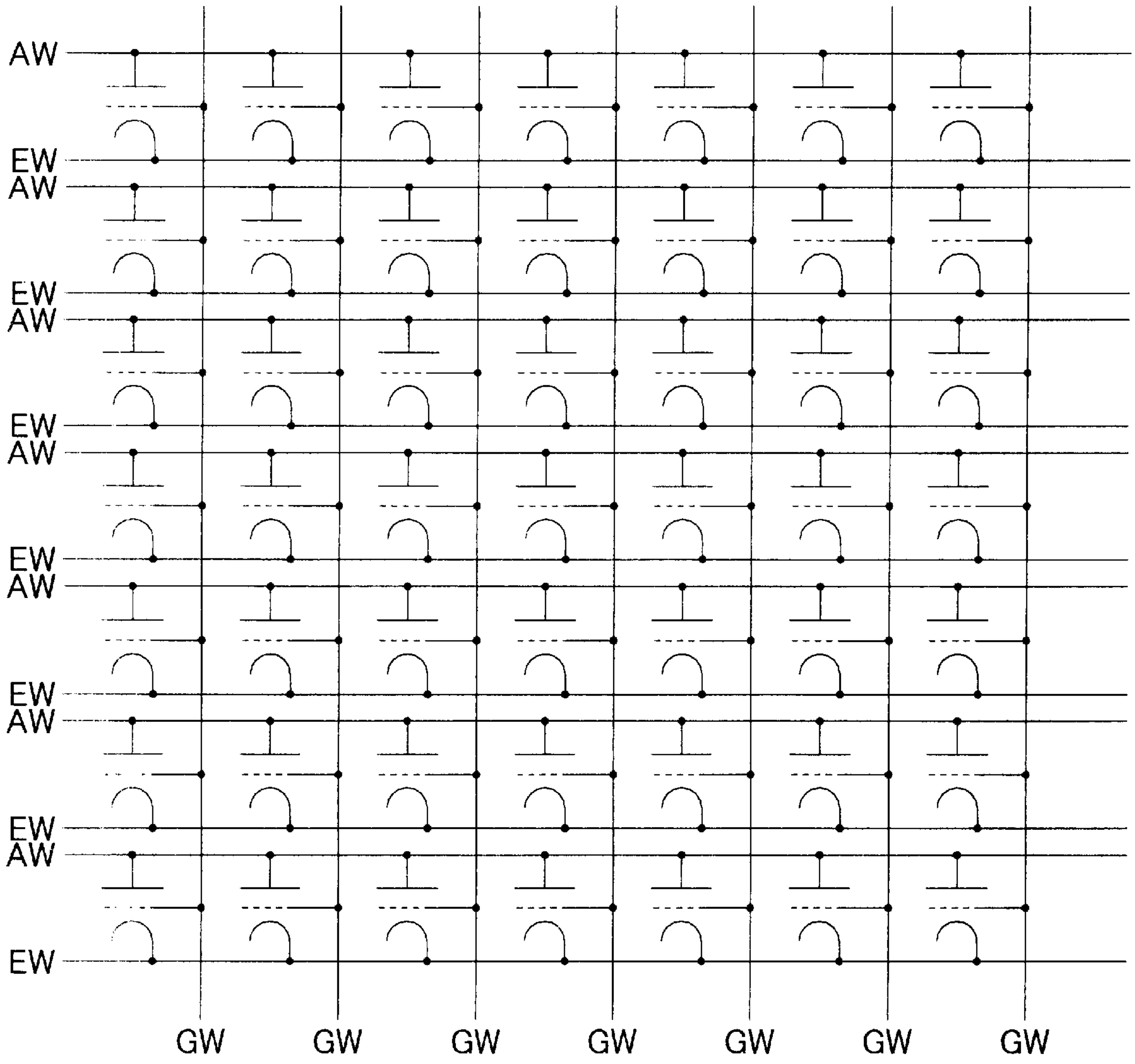
FIG. 8 is an equivalent circuit diagram depicting an example configuration of a field emitter array.

FIG. 8 is an equivalent circuit diagram that represents an electrical circuit for a flat panel display. The flat panel display consists of a field emission emitter array (FEA) containing multiple diodes or triodes.

Triodes are positioned at the cross points of the emitter wirings EW and gate wirings GW that are distributed in two dimensions. Each of the triode anode electrodes (transparent substrate) 47 is continually maintained at a positive potential by anode wirings AW. Each triode can be two-dimensionally selected by means of its emitter wiring EW and gate wiring GW. In other words, the triodes located at the cross point between the emitter and gate wirings to which the voltage is applied are selected.

To the emitter electrode and gate electrode of each triode selected, a negative potential and a positive potential are applied, respectively, and electrons are emitted from the emitter electrode toward the anode electrode.

The present invention has been described along the foregoing embodiments, but the present invention is not limited thereto. It will be apparent to those skilled in the art that various modifications, improvements, combinations, etc. are possible.

What is claimed is:

1. A method for manufacturing a field emission element comprising the steps of:

preparing a substrate having an opening at least in its front surface;

depositing a sacrificial film on said substrate, to form a mold concavity having a sharp concavity point in said opening;

forming a film made up of electrically conducting ultra fine particles on said sacrificial film to bury said mold opening; and removing at least that portion of said sacrificial film that is at said concavity point.

2. The method for manufacturing a field emission element according to claim 1, wherein said step of forming a film made up of electrically conducting ultra fine particles comprises heating said substrate.

3. The method for manufacturing a field emission element according to claim 1, wherein said step of forming a film made up of electrically conducting ultra fine particles comprises applying a fluid in which electrically conducting ultra fine particles are dispersed in an organic solvent, as a fluid film, to said substrate; and heating said substrate to vaporize said organic solvent from said fluid film, causing said electrically conducting ultra fine particles to come into mutual contact, and causing the particles to grow.

4. The method for manufacturing a field emission element according to claim 1, wherein said step of forming a film made up of electrically conducting ultra fine particles comprises supplying and depositing electrically conducting ultra fine particles dispersed in a gas onto said substrate.

5. The method for manufacturing a field emission element according to claim 1, wherein said substrate comprises a supporting substrate and a surface layer formed thereon, having an opening with substantially perpendicular side walls.

6. The method for manufacturing a field emission element according to claim 5, wherein said surface layer contains a low-melting-point material layer, and the method further comprising the step of heating said substrate, causing low-melting-point material layer to reflow.

7. The method for manufacturing a field emission element according to claim 5, wherein said surface layer contains an electrically conducting layer.

* * * * *